US006774416B2

(12) United States Patent
Nelson

(10) Patent No.: US 6,774,416 B2
(45) Date of Patent: Aug. 10, 2004

(54) SMALL AREA CASCODE FET STRUCTURE OPERATING AT MM-WAVE FREQUENCIES

(75) Inventor: Stephen R. Nelson, Springfield, MO (US)

(73) Assignee: Nanowave, Inc, Richardson, TX (US)

( * ) Notice: Subject to any disclaimer, the term of this patent is extended or adjusted under 35 U.S.C. 154(b) by 17 days.

(21) Appl. No.: 09/906,312

(22) Filed: Jul. 16, 2001

(65) Prior Publication Data

US 2003/0011008 A1 Jan. 16, 2003

(51) Int. Cl.[7] .............................................. H01L 29/80
(52) U.S. Cl. ...................... 257/275; 257/275; 257/276; 257/288; 257/522; 257/523
(58) Field of Search ................................. 257/275, 288, 257/276, 522, 523; 330/307

(56) References Cited

U.S. PATENT DOCUMENTS

| | | | | |
|---|---|---|---|---|
| 3,969,745 A | * | 7/1976 | Blocker, III ................. | 357/22 |
| 4,100,438 A | | 7/1978 | Yokoyama ................... | 307/304 |
| 4,298,879 A | * | 11/1981 | Hirano ......................... | 357/22 |
| 4,549,197 A | * | 10/1985 | Brehm et al. ................. | 357/41 |
| 4,550,291 A | | 10/1985 | Millaway et al. ........... | 330/277 |
| 4,615,010 A | | 9/1986 | Davis et al. ................. | 364/491 |
| 4,720,685 A | | 1/1988 | Garuts ......................... | 330/149 |
| 4,812,780 A | | 3/1989 | Zimmerman ................. | 330/253 |
| 4,974,039 A | * | 11/1990 | Schindler et al. ............ | 357/22 |
| 4,992,752 A | | 2/1991 | Cioffi .......................... | 330/54 |
| 5,023,677 A | * | 6/1991 | Truitt .......................... | 357/22 |
| 5,025,296 A | * | 6/1991 | Fullerton et al. ........... | 357/23.8 |
| 5,185,534 A | * | 2/1993 | Sakamoto et al. .......... | 257/276 |
| 5,233,313 A | * | 8/1993 | Kohno et al. ................ | 330/277 |
| 5,274,256 A | * | 12/1993 | Shiga ........................... | 257/270 |
| 5,283,452 A | * | 2/1994 | Shih et al. ................... | 257/277 |
| 5,287,072 A | * | 2/1994 | Kojima et al. .............. | 330/307 |
| 5,298,815 A | | 3/1994 | Brunolli ...................... | 307/530 |
| 5,351,163 A | * | 9/1994 | Dawson et al. ........... | 361/321.1 |
| 5,381,157 A | * | 1/1995 | Shiga .......................... | 343/700 |
| 5,401,987 A | | 3/1995 | Hiser et al. ................. | 257/204 |
| 5,726,613 A | | 3/1998 | Hayashi et al. ............. | 333/214 |
| 5,734,189 A | | 3/1998 | Pribble ....................... | 257/401 |
| 5,825,245 A | | 10/1998 | Michail et al. ............. | 330/253 |
| 5,835,994 A | | 11/1998 | Adams ........................ | 323/315 |
| 5,856,687 A | | 1/1999 | Kimura ....................... | 257/235 |
| 5,883,407 A | * | 3/1999 | Kunii et al. ................. | 257/275 |
| 6,081,006 A | * | 6/2000 | Nelson ........................ | 257/276 |
| 6,094,084 A | | 7/2000 | Abou-Allam et al. ....... | 327/359 |
| 6,545,543 B2 | * | 4/2003 | Nelson ........................ | 330/307 |
| 2003/0006847 A1 | * | 1/2003 | Nelson ........................ | 330/307 |

OTHER PUBLICATIONS

PCT Notification of Transmittal of the International Search Report dated Aug. 27, 2003.

* cited by examiner

*Primary Examiner*—Allan R. Wilson
*Assistant Examiner*—Edgardo Ortiz
(74) *Attorney, Agent, or Firm*—Jenkens & Gilchrist PC

(57) ABSTRACT

A small area cascode FET structure capable of operating at mm-wave frequenices cascades a common-source (CS) FET with a common gate (CG) FET, in a smaller physical area than conventional cascode FET structures. The small area of the cascode FET structure is partially achieved by using small source via grounds, requiring a thin gallium arsenide substrate (typically between 50 and 70 microns thick). The overall cascode area is reduced further, by having the two FETs share a common node. This common node is the output drain manifold of the CS FET, which is also an input source finger of the CG FET. In addition, small via grounds within the MIM capacitors and CS FET, which provide the ground connection to the gate manifolds of the CG FET, further reduce circuit area. Advantageously, the small area cascode FET can be applied to many different MMICs to reduce MMIC area requirements and cost.

45 Claims, 5 Drawing Sheets

US 6,774,416 B2

SMALL AREA CASCODE FET STRUCTURE OPERATING AT MM-WAVE FREQUENCIES

BACKGROUND OF THE INVENTION

1. Field of the Invention

The present invention relates generally to transistors capable of operating at mm-wave frequencies, and specifically to microwave/mm-wave cascode transistor structures.

2. Description of Related Art

Cascode circuits have been in use in the electronics industry for decades, first using vacuum tubes, and later, field effect transistors. Cascode transistor circuit elements are the basic building blocks of many hybrid and integrated circuits. Much of the early cascode circuit work was focused on low frequency applications. Therefore, cascode FET layouts for small area transistor monolithic microwave integrated circuits (MMIC) and mm-wave frequency operations were not developed early on. Today, high volume commercial radio markets at mm-wave frequencies (30 GHz and higher) are driving the need for new, small area MMIC amplifiers and circuits, which require a different transistor design and layout approach to achieve MMIC area and cost goals.

A simple circuit schematic of two FETs 100A and 100B in a cascode configuration 170 is shown in FIG. 1. The RF input is to the gate 130A of the common source FET 100A at the left, and the RF output is to the drain 120B of the common gate FET 100B at the right. The drain 120A of the common source FET 100A interconnects with the source 150B of the common gate FET 100B. The source 150A of the common source FET 100A is connected to ground 180. In most circuit applications, the gate 130B of the common gate FET 100B is RF grounded, using capacitors to ground 180. This is typically achieved using metal-insulator-metal (MIM) capacitors 300 on GaAs MMICs, and via grounds, to "ground" the bottom plate of the capacitor to the backside of the MMIC.

The common source 100A and common gate 100B FETs typically have the same gate 130A and 130B widths in a cascode structure 170, but this is not an absolute requirement. The gate 130A and 130B widths can be different, and if so, this requires a more complex biasing scheme for such a structure, because one FET has a higher IDSS (saturated drain-source current) than the other.

FIG. 2 shows two interdigitated FETs 100A and 100B in a conventional cascode configuration 170 and layout, i.e., a cascade of a common source FET 100A with a common-gate FET 100B. Each FET 100 includes a plurality of transversely spaced Metal-Schottky field effect transistor (MESFET) unit cells fabricated on a GaAs substrate, each including a doped source, drain and channel regions (not shown) formed within an active region 110 of the GaAs substrate. Each FET 100 further includes a plurality of parallel, elongated drain fingers 125 which overlie the drain regions of the MESFETs, and which are in electrical connection therewith. The drain fingers 125 of both FETs 100 are interconnected together at one end by a drain manifold 120. Each FET 100 further includes a plurality of source fingers 150 in electrical connection with the source regions of the MESFETs interspersed between the respective drain fingers 125. Furthermore, a plurality of gate fingers 135 in electrical connection with the channel regions of the MESFETs are interspersed between the respective drain fingers 125 and source fingers 150. The gate fingers 135 are interconnected together at one end by respective gate manifolds 130.

The drain manifold 120A of the CS FET 100A provides the input to the source fingers 150B of the CG FET 100B via drain air bridges 160 overlying the gate manifold 130B of the CG FET 100B. The drain manifold 120B of the CG FET 100B enables the drain fingers 125B of the CG FET 100B to be collectively connected to external circuitry. The gate manifold 130A of the CS FET 100A provides the input signal to the gate fingers 135A of the CS FET 100A in parallel, whereas the gate manifold 130B of the CG FET 100B is connected by metal-insulator-metal (MIM) capacitors (not shown) to a ground plane (not shown) on the opposite side of the GaAs substrate. This provides RF ground to the gate 130B of the CG FET 100B.

Source connection pads 140 provided on either side of the CS FET 100A are connected to the ground plane on the opposite side of the GaAs substrate by electrically conductive vertical interconnects or vias 145. The source fingers 150A of the CS FET 100A are connected to the source connection pads 140 by electrically conductive source air bridges 155. The source air bridges 155 extend over the drain fingers 125A and gate fingers 135A and are connected to the metallization of the source fingers 150A. However, the large source via grounds 145 in the source connection pads 140 of the conventional cascode FET structure 170 of FIG. 2 take up significant MMIC area.

SUMMARY OF THE INVENTION

A small area cascode FET structure capable of operating at mm-wave frequencies cascades a common source (CS) FET with a common gate (CG) FET, in a smaller physical area than conventional cascode FET structures. The small area of the exemplary cascode FET structure is partially achieved by using small source via grounds, requiring a thin gallium arsenide (GaAs) substrate (typically between 50 and 70 microns thick). The overall cascode area is reduced further, by having the two FETs share a common node. This common node is the output drain manifold of the CS FET, which is also an input source finger of the CG FET. In addition, small via grounds within the MIM capacitors further reduce circuit area. These features make the overall cascode FET structure much smaller in area than one could achieve using two separate common source and common gate reduced size FETs. Advantageously, the small area cascode FET can be applied to many different MMICs to reduce MMIC area requirements and cost.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF THE EXEMPLARY EMBODIMENTS

The numerous innovative teachings of the present application will be described with particular reference to the exemplary embodiments. However, it should be understood that these embodiments provide only a few examples of the many advantageous uses of the innovative teachings herein. In general, statements made in the specification of the present application do not necessarily delimit any of the various claimed inventions. Moreover, some statements may apply to some inventive features, but not to others.

Figure 1:
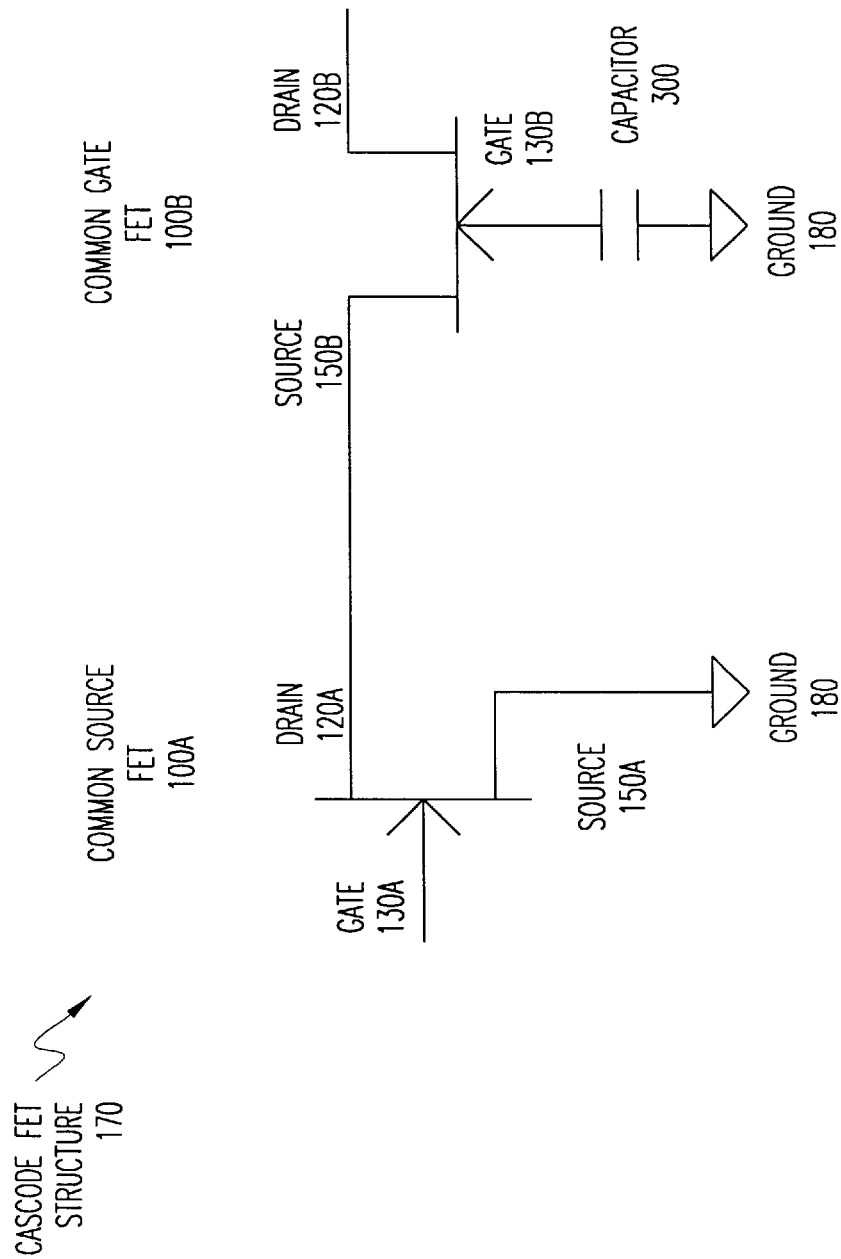
FIG. 1 is a circuit schematic of two field effect transistors (FETs) in a cascode configuration.
Figure 2:
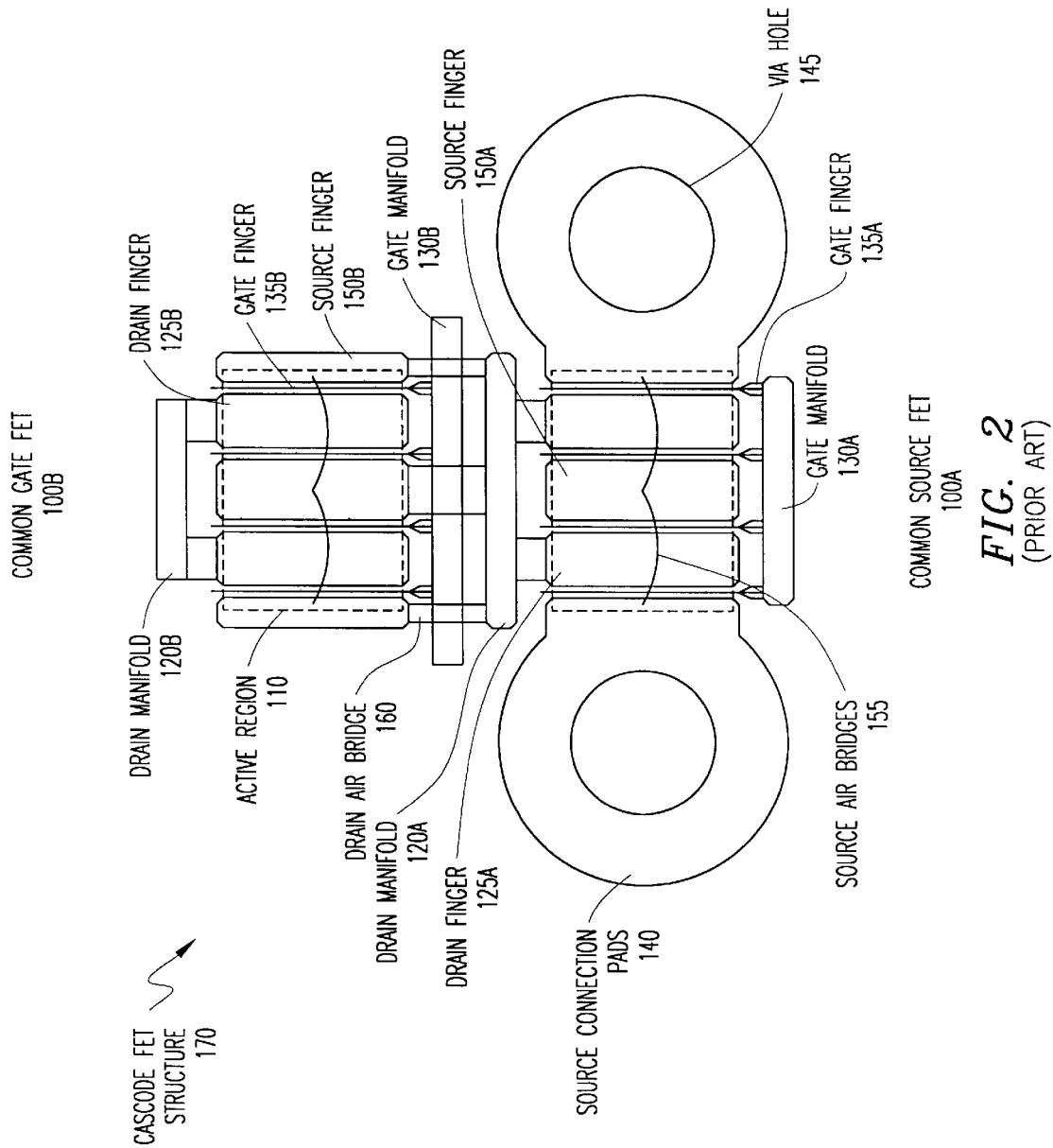
FIG. 2 illustrates two interdigitated FETs in a conventional cascode configuration.
Figure 3:
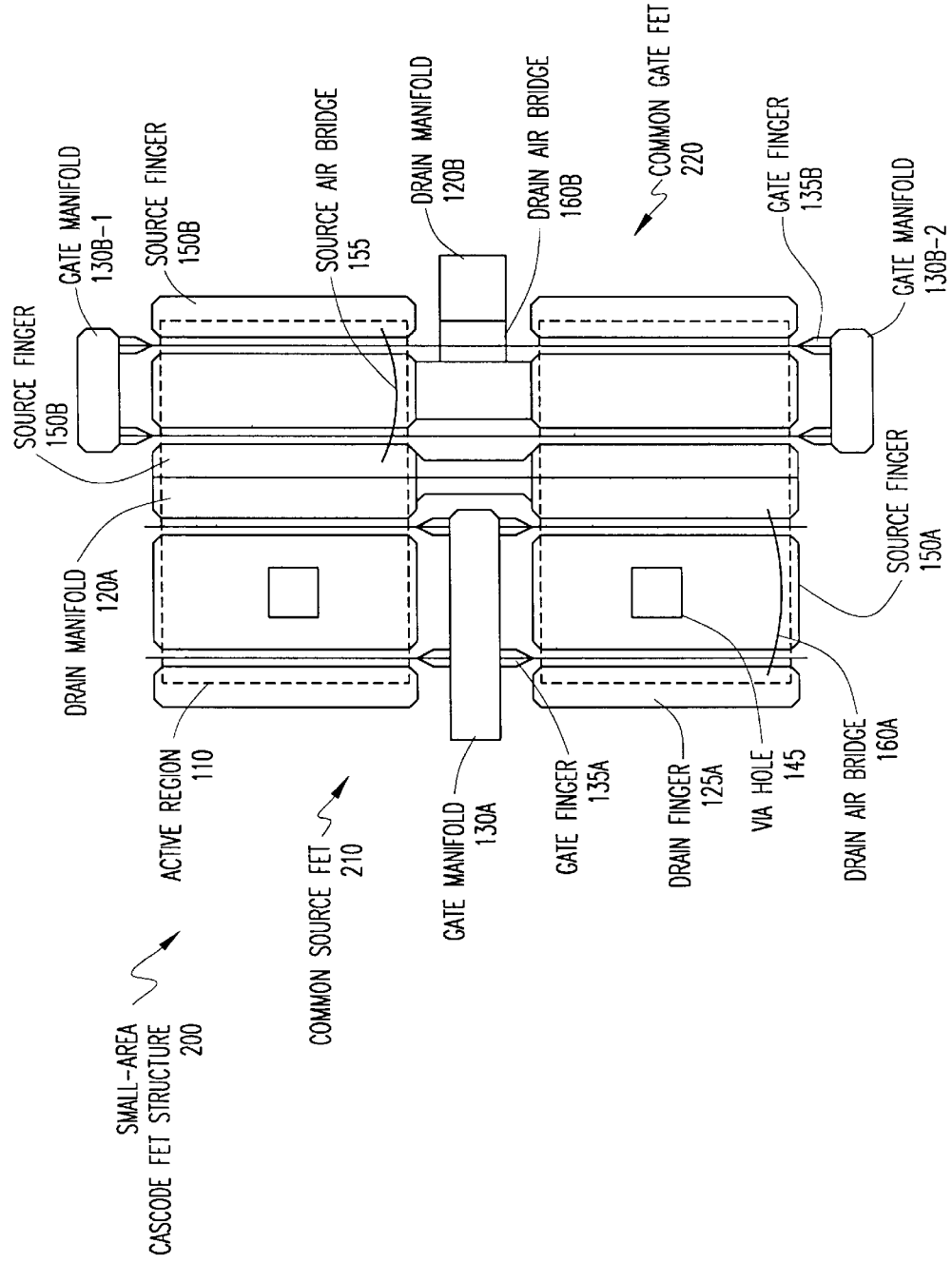
FIG. 3 illustrates a cascode FET structure in accordance with embodiments of the present invention.

FIG. 3 illustrates a microwave/mm-wave cascode FET structure 200, which reduces MMIC circuit area for a variety of circuits where high frequency FET cascodes are used. A common source (CS) FET 210 is cascaded with a common gate (CG) FET 220, in a small area compared with conventional cascode structures (shown in FIG. 2). The small area of the resulting cascode structure 200 (CS-CG) is partially achieved by using small source via grounds. In addition, the overall cascode area is reduced further by having the two FETs 210 and 220 share a common node. This common node is the output drain manifold 120A of the CS FET 210, which also serves as an input source finger 150B of the CG FET 220. These features make the overall cascode FET structure 200 much smaller in area than using two separate common source and common gate FETs.

The CS FET 210 shown in FIG. 3 resembles a reduced size FET of the type described in U.S. Pat. No. 6,081,006 to Nelson (hereinafter referred to as Nelson), which is hereby incorporated by reference. The Nelson FET 210 contains a single gate manifold 130A with multiple gate "stripes" (fingers) 135A extending from both sides of the gate manifold 130A. The drain fingers 125A on both sides of the gate manifold 130A are interconnected by drain air bridges 160A to the drain manifold 120A at one end of the reduced size FET 210. In the Nelson FET 210, instead of connecting all of the source fingers 150A to a grounded source connection pad (as shown in FIG. 2), each of the source fingers 150A are individually connected to the ground plane (ground connection) on the opposite side of the GaAs substrate by electrically conductive vertical interconnects or via holes 145. The small via holes 145 are typically 35 microns or smaller in diameter, and are achieved by using a thin GaAs substrate (typically between 20 and 70 microns thick). It should be noted that the via hole can be any shape, such as square, rectangular, elliptical, circular, etc. In addition, it should be understood that the specific dimensions of the via hole or GaAs substrate are listed here merely as an example, and other dimensions may be possible.

In FIG. 3, the CS FET 210 at left is an integral part of the CG FET 220 at right, and vice versa. Thus, the drain electrode (drain manifold 120A) of the CS FET 210 is the source electrode (input source finger 150B) of the CG FET 220 (i.e., the source electrode 150B is integrally formed with the drain electrode 120A). The source fingers 150B of the CG FET 220 are connected together via source air bridges 155. The drain fingers 125B of the CG FET 220 are interconnected to the drain manifold 120B via drain air bridges 160B. Furthermore, the CG FET 220 has two gate manifolds 130B-1 and 130B-2 that are grounded via MIM capacitors (not shown). The gate fingers 135B of the CG FET 220 extend between the gate manifolds 130B-1 and 130B-2, and are interspersed between the respective drain fingers 125B and source fingers 150B.

The gates 130A and 130B of both the CS FET 210 and CG FET 220 can be accessed and biased separately in the small area cascode FET structure 200. RF input is applied to the gate manifold 130A of the CS FET 210 and RF output is taken from the drain manifold 120B of the CG FET 220. The RF path length from input to output of the small area cascode FET structure 200 is shorter than that of a conventional cascode microwave FET structure (shown in FIG. 2), enabling higher frequency operation.

Figure 4:
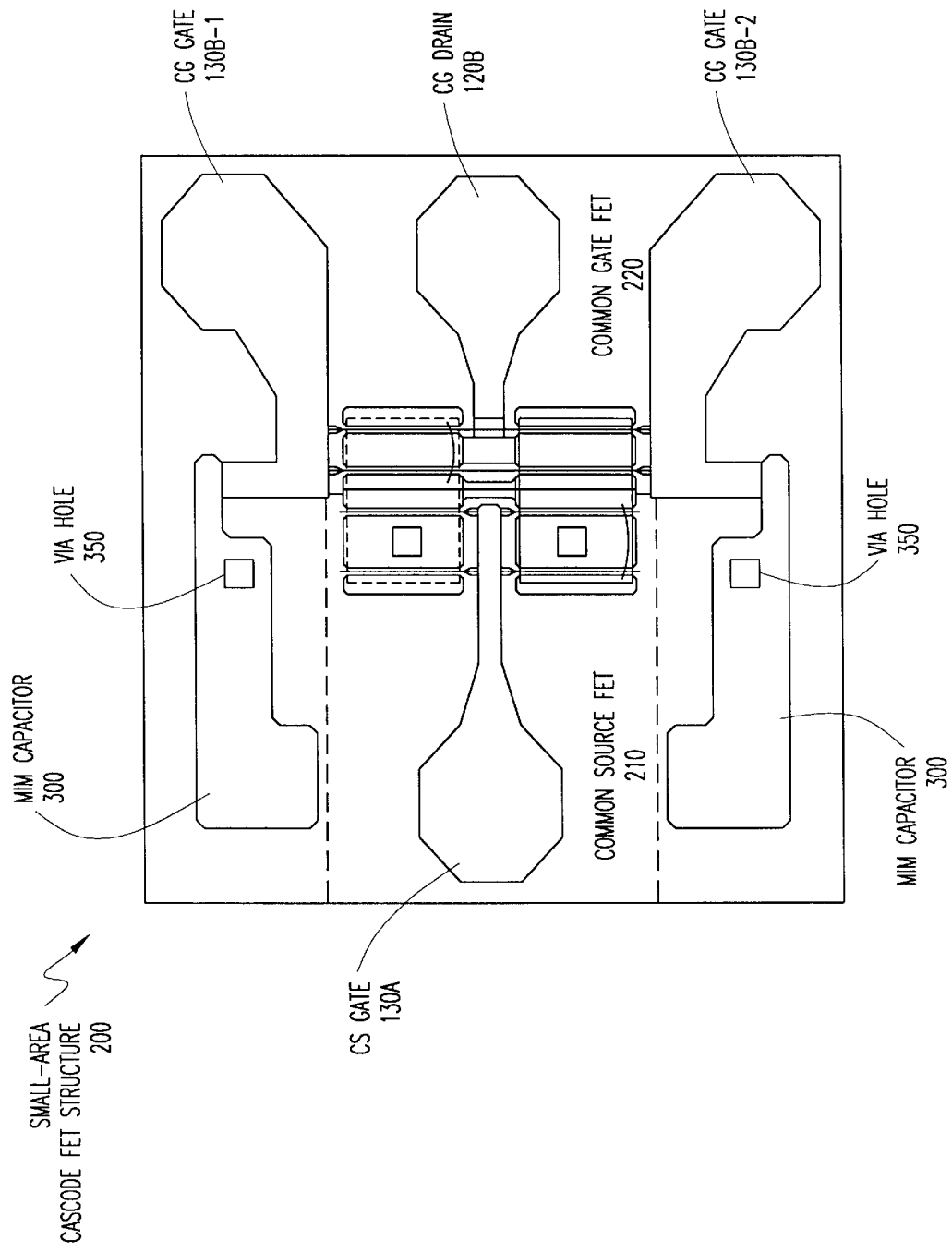
FIG. 4 illustrates a cascode FET layout with shunt metal-insulator-metal (MIM) capacitors, in accordance with embodiments of the present invention.

As shown in FIG. 4, the ability to produce small via grounds also simplifies the layout of grounded MIM capacitors 300. Shunt MIM capacitors 300 provide RF ground to the gates 130 of the CG FET 220. Two 2 pF MIM capacitors 300A and 300B are shown, each connected to a separate gate manifold 130B-1 and 130B-2 of the CG FET 220. Small via grounds 350A and 350B within each of the MIN capacitors 300A and 300B, respectively, enable connection of the MIM capacitors 300A and 300B to the ground plane on the opposite side of the GaAs substrate. The via grounds 350A and 350B within each of the MIM capacitors 300A and 300B preferably have the same dimensions as the via holes 145 shown in FIG. 3. However, it should be understood that the via grounds 350A and 350B may have different dimensions than the via holes 145 shown in FIG. 3. Due to the small MIM via grounds 350, in addition to the other area-saving features described above in connection with FIG. 3, the small area cascode FET structure 200 of FIG. 4 requires less integrated circuit area than a standard interdigitated cascode FET structure.

Although both cascode FET structures (FIGS. 2 and 4) operate to high frequencies, the small area cascode FET structure 200 of FIG. 4 has higher gain, primarily due to the fact that the small area cascode FET structure 200 is shorter and has less inductance in the RF through path. The predicted performance of the small area cascode FET structure 200 is dependent upon the gate finger 135 width (FET channel width) selected for the structure. For example, the small area cascode FET structure 200 shown in FIG. 4, with 75-um gate finger widths (×4=300 um for the CS and CG FET widths), and 0.25-um gate lengths, offers high predicted maximum available gain (>12 dB MAG at 30 GHz) if processed on power pseudomorphic high electron mobility transistor (pHEMT) epitaxial material, to frequencies above 40 GHz.

As is well-known in the art, dual-gate FETs (not shown) have also been modeled as cascode circuits. When the common source and common gate FETs are tightly interconnected, as is the case for a dual-gate FET structure, the structure can also be called a cascode FET. The small area cascode FET structure 200 of FIGS. 3 and 4 also offers performance and processing advantages over dual-gate FETs.

Dual-gate FETs require two closely spaced gates in each FET channel of a multi-channel transistor, with gates typically spaced 1 to 1.5 um apart. These gates can be very difficult to process with high yield for high frequency applications. Therefore, high frequency, mm-wave transistors often employ T-gate or "mushroom" gate structures, to increase the metal cross-sectional area of the gate and to reduce gate resistance. Processing two of these gates very close if to each other can lead to metal shorts between gates. By contrast, the small area cascode FET structure 200 described in FIGS. 3 and 4 has separate FET channels (and gate fingers 135) for both the CS FET 210 and CG FET 220. Therefore, the small area cascode FET does not experience the problem of metal shorts between gates of dual-gate FETs.

Dual-gate FETs can also demonstrate unusual cold temperature behavior, including sluggish response (rise/fall) time to modulation signal inputs at cold temperatures, because of surface effects or defects in the channel between the dual (two) gates. By contrast, the small area cascode FET structure 200 of FIGS. 3 and 4 does not suffer from these cold temperature effects, since the gate fingers 135 and channels of the CS FET 210 and CG FET 220 are isolated from each other. In addition, the small area cascode FET structure 200 also offers higher reverse isolation than can be achieved from a dual-gate FET. Higher transistor isolation is important in building stable amplifiers, in achieving high isolation levels from switches and attenuators and in building high port-to-port isolation mixers. Furthermore, the small area cascode FET structure 200 operates to higher frequencies than dual-gate FETs, because higher intrinsic isolation levels can be achieved by the small area cascode FET structure 200, and there is much lower parasitic capacitance between the two gate structures of the small area cascode FET 200.

Figure 5:
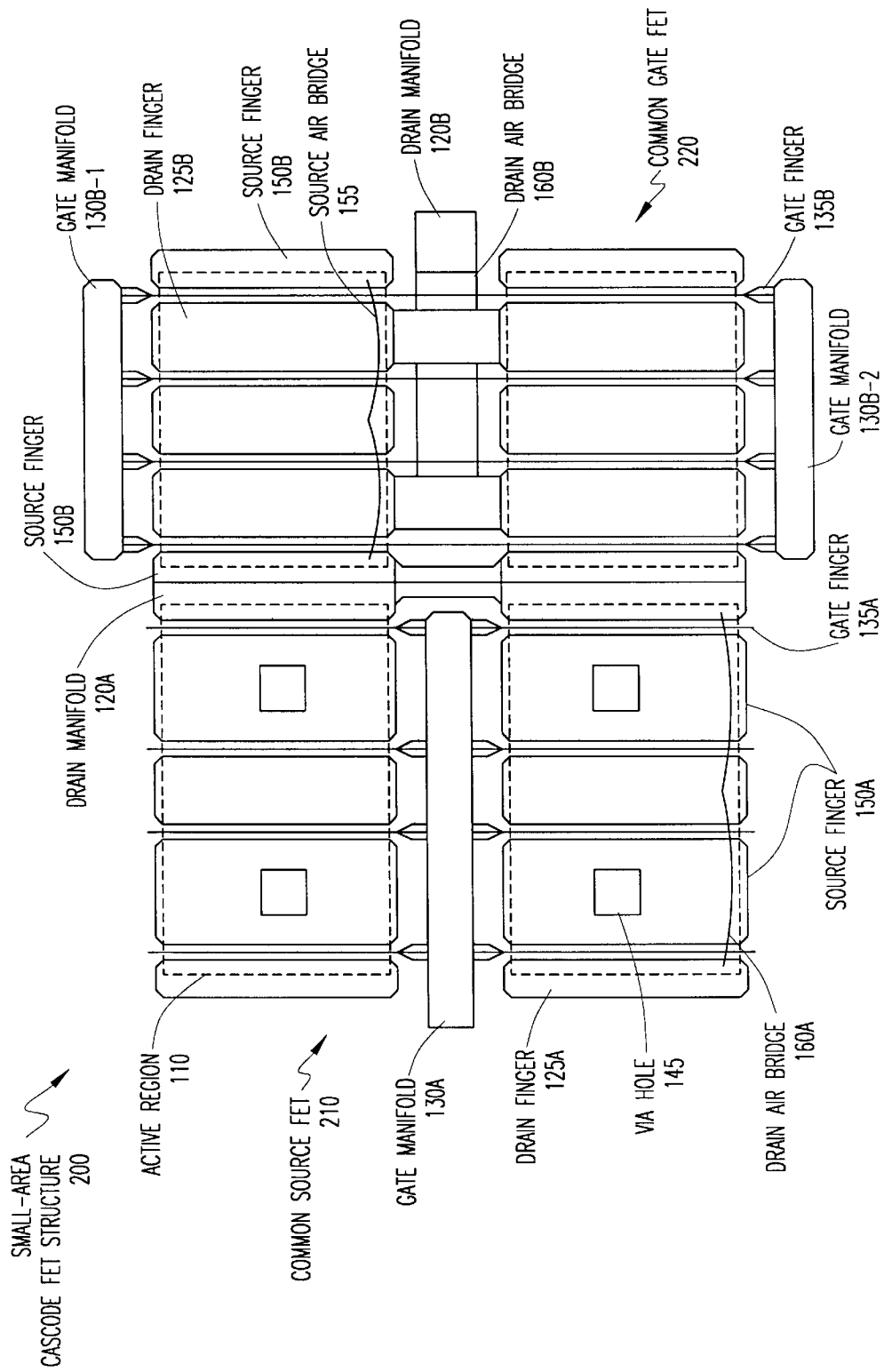
FIG. 5 illustrates a larger gate width cascode FET structure, in accordance with embodiments of the present invention.

FIG. 5 illustrates a larger gate width cascode FET structure 200, with twice the number of gate fingers 135 as that shown in FIG. 3. The larger gate width cascode FET structure 200 is an extension of the small area cascode FET structure in FIG. 3, but the larger gate width offers higher output power. The small area cascode FET structure 200 of FIG. 5 has 8 FET channels (8 gate fingers 135) in both the CS FET 210 and the CG FET 220. Therefore, the cascode FET structure 200 of FIG. 5 offers approximately twice the output power of the cascode FET structure 200 of FIG. 3. It should be understood that the small area cascode FET structure 200 described herein is not limited to any specific number of FET channels, but can be used with any number of FET channels.

It should also be understood that any number of the small area cascode FET structures 200 described herein may be used within any number of different circuit arrangements. For example, FET cascodes are currently used in a wide range of RF and microwave circuits. These include high gain amplifiers, attenuators, mixers, switches, limiters and a variety of other circuits. Specifically, wideband distributed amplifiers, which are used in electro-optic, radio and various military hardware applications (for instance, electronic warfare jammers and receivers), typically demonstrate 2 to 3 dB higher gain with cascode structures than with, for instance, common source FETs only (i.e., 11 dB gain vs. 8 dB gain, for example, for cascode FET vs. common source FET distributed amplifiers operating at frequencies to 40 GHz or higher). This is partially because cascode circuits have higher output impedance and create less loss in distributed amplifier artificial drain lines, and also because the common gate FET, cascaded with the common source FET, increases the overall gain of the structure.

In addition, standard reactively matched, or lossy-reactively matched amplifiers also demonstrate higher gain using cascode FETs than can be achieved using common source FETs. Since the cascode gates (gate 1-CS, gate 2-CG) can be biased separately, the second gate bias can be used to adjust (vary) the gain and power of an amplifier. Amplifiers that use FET cascodes can provide variable gain and power, which is needed in many transmitter and receiver applications. Various modulator circuits can also be designed using FET cascode structures.

Furthermore, cascode circuits can be operated at higher operating voltages than for instance, common-source FET circuits, because effectively the cascode places two FETs in series (CS and CG). This is useful in many high voltage amplifier applications, and in some high power switch applications. Since different signals can be applied at the two FET cascode gate inputs and mixed together, unique mixer circuits can also be made using cascodes. The second gate does not have to be RF grounded in these applications, or it may be effectively RF grounded at high frequencies, but able to accept signals at IF frequencies, which can help isolate IF and RF/LO ports.

As will be recognized by those skilled in the art, the innovative concepts described in the present application can be modified and varied over a wide range of applications. Accordingly, the scope of patented subject matter should not be limited to any of the specific exemplary teachings discussed, but is instead defined by the following claims.

What is claimed is:

1. A cascode transistor structure capable of operating at mm-wave frequencies, comprising:
   a common source transistor having a drain electrode; and
   a common gate transistor having a source electrode, said source electrode being integrally formed with said drain electrode of said common source transistor; and wherein said drain electrode comprises one or more drain fingers and a drain manifold interconnected with said at least one drain finger, said drain manifold being integrally formed with said source electrode of said common gate transistor.

2. The structure of claim 1, wherein said source electrode comprises one or more source fingers, an input one of said one or more source fingers being integrally formed with said drain manifold of said common source transistor.

3. The structure of claim 2, wherein each of said one or more drain fingers of said common source transistor are interconnected with said drain manifold by drain air bridges overlying one or more source fingers and one or more gate fingers of said common source transistor.

4. The structure of claim 3, wherein said input source finger of said common gate transistor is interconnected with other ones of said one or more source fingers via source air bridges overlying one or more drain fingers and one or more gate fingers of said common gate transistor.

5. The structure of claim 1, wherein said common source transistor farther comprises at least one source finger, each of said at least one source finger having a via hole therein for connecting said respective source finger to a ground connection.

6. The structure of claim 5, wherein each said via hole has a diameter equal to or less than 35 microns.

7. The structure of claim 6, wherein said common source transistor and said common gate transistor are formed within an active region on a first side of a gallium arsenide substrate.

8. The structure of claim 7, wherein said gallium arsenide substrate has a thickness between 20 and 70 microns.

9. The structure of claim 7, wherein said ground connection is formed on a second side of said gallium arsenide substrate.

10. The structure of claim 1, wherein said common source transistor is a field effect transistor.

11. The structure of claim 1, wherein said common gate transistor is a field effect transistor.

12. A cascode transistor structure capable of operating at mm-wave frequencies, comprising:
   a common source transistor having a drain electrode and one or more source fingers, each of said source fingers having a respective via hole therein for connecting said respective source finger to a ground connection; and
   a common gate transistor having a source electrode, said source electrode being integrally formed with said drain electrode of said common source transistor, said common gate transistor further having a gate electrode, said gate electrode being connected to said ground connection via capacitance elements.

13. The structure of claim 12, wherein said drain electrode comprises one or more drain fingers and a drain manifold interconnected with said at Least one drain finger, said drain manifold being integrally formed with said source electrode of said common gate transistor.

14. The structure of claim 13, wherein said source electrode comprises one or more source fingers, an input one of said one or more source fingers being integrally formed with said drain manifold of said common source transistor.

15. The structure of claim 14, wherein each of said one or more drain fingers of said common source transistor are interconnected with said drain manifold by drain air bridges overlying said one or more source fingers and one or more gate fingers of said common source transistor.

16. The structure of claim 15, wherein said input source finger of said common gate transistor is interconnected with other ones of said one or more source fingers via source air bridges overlying one or more drain fingers and one or more gate fingers of said common gate transistor.

17. The structure of claim 12, wherein each said via hole has a diameter equal to or less than 35 microns.

18. The structure of claim 17, wherein said common source transistor and said common gate transistor are formed within an active region on a first side of a gallium arsenide substrate.

19. The structure of claim 18, wherein said gallium arsenide substrate has a thickness between 20 and 70 microns.

20. The structure of claim 18, wherein said ground connection is formed on a second side of said gallium arsenide substrate.

21. The structure of claim 12, wherein said gate electrode of said common gate transistor comprises first and second gate manifolds, said first and second gate manifolds being connected to said ground connection via respective ones of said capacitance element.

22. The structure of claim 12, wherein said common source transistor is a field effect transistor.

23. The structure of claim 12, wherein said common gate transistor is a field effect transistor.

24. A cascode circuit capable of operating at mm-wave frequencies, comprising:
a common source transistor having a drain electrode and one or more source fingers, each of said source fingers having a respective via hole therein for connecting said respective source finger to a ground connection; and
a common gate transistor having a source electrode, said source electrode being integrally formed with said drain electrode of said common source transistor, said common gate transistor further having a gate electrode, said gate electrode being connected to said ground connection via capacitance elements.

25. The circuit of claim 24, wherein said drain electrode comprises one or more drain fingers and a drain manifold interconnected with said at least one drain finger, said drain manifold being integrally formed with said source electrode of said common gate transistor.

26. The circuit of claim 25, wherein said source electrode comprises one or more source fingers, an input one of said one or more source fingers being integrally formed with said drain manifold of said common source transistor.

27. The circuit of claim 14, wherein each of said one or more drain fingers of said common source transistor are interconnected with said drain manifold by drain air bridges overlying said one or more source fingers and one or more gate fingers of said common source transistor.

28. The circuit of claim 27, wherein said input source finger of said common gate transistor is interconnected with other ones of said one or more source fingers via source air bridges overlying one or more drain fingers and one or more gate fingers of said common gate transistor.

29. The circuit of claim 24, wherein each said via hole has a diameter equal to or less than 35 microns.

30. The circuit of claim 29, wherein said common source transistor and said common gate transistor are formed within an active region on a first side of a gallium arsenide substrate.

31. The circuit of claim 30, wherein said gallium arsenide substrate has a thickness between 20 and 70 microns.

32. The circuit of claim 31, wherein said ground connection is formed on a second side of said gallium arsenide substrate.

33. The circuit of claim 24, wherein said gate electrode of said common gate transistor comprises first and second gate manifolds, said first and second gate manifolds being connected to said ground connection via respective ones of said capacitance element.

34. The circuit of claim 24, wherein said common source transistor is a field effect transistor.

35. The circuit of claim 24, wherein said common gate transistor is a field effect transistor.

36. A cascode circuit capable of operating at mm-wave frequencies, comprising:
a common source transistor having a gate manifold connected to receive an input signal and supplying said input signal to one or more gate fingers extending from opposite sides of said gate manifold, each of said one or more gate fingers being interspersed between a respective source finger and a respective drain finger, each of said respective source fingers having a via hole therein for connecting each of said respective source fingers to a ground connection, each of said respective drain fingers being interconnected by a drain manifold; and
a common gate transistor having one or more source fingers, an input one of said one or more source fingers being integrally formed with said drain manifold of said common source transistor, said common gate transistor further having first and second gate manifolds connected to said ground connection, each of said first and second gate manifolds having respective gate fingers extending therefrom, each of said gate fingers being interspersed between a respective one of said one or more source fingers and a respective drain finger, each of said respective drain fingers being interconnected by a drain manifold to provide an output signal.

37. The circuit of claim 36, wherein said common source transistor and said common gate transistor are formed within an active region on a first side of a gallium arsenide substrate.

38. The circuit of claim 37, wherein said gallium arsenide substrate has a thickness between 20 and 70 microns.

39. The circuit of claim 38, wherein each said via hole has a diameter equal to or less than 35 microns.

40. The circuit of claim 37, wherein said ground connection is formed on a second side of said gallium arsenide substrate.

41. The circuit of claim 36, wherein each of said drain fingers of said common source transistor are interconnected with said drain manifold by drain air bridges overlying said source fingers and said gate fingers of said common source transistor.

42. The circuit of claim 36, wherein said input source finger of said common gate transistor is interconnected with other ones of said one or more source fingers via source air bridges overlying said drain fingers and said gate fingers of said common gate transistor.

43. The circuit of claim 36, wherein said common source transistor is a field effect transistor.

44. The circuit of claim 36, wherein said common gate transistor is a field effect transistor.

45. The circuit of claim 36, wherein said circuit is a monolithic microwave integrated circuit.

* * * * *